United States Patent
Kurrer et al.

[11] Patent Number: 5,940,276
[45] Date of Patent: Aug. 17, 1999

[54] FRONT SYSTEM OF A PRINTED CIRCUIT BOARD ASSEMBLY HAVING AN INTEGRATED PUSH-BUTTON ELEMENT FOR ACTIVE-PASSIVE SWITCHING

[75] Inventors: Siegfried Kurrer, Nuremberg; Werner Korber, Betzenstein; Ernst Billenstein, Burgbernheim; Kurt-Michael Schaffer, Eckental, all of Germany

[73] Assignee: Siemens Aktiengesellschaft, Munich, Germany

[21] Appl. No.: 08/989,668

[22] Filed: Dec. 12, 1997

Related U.S. Application Data

[63] Continuation of application No. PCT/DE95/01078, Aug. 16, 1995.

[30] Foreign Application Priority Data

Jun. 12, 1995 [DE] Germany .......................... 29509602 U

[51] Int. Cl.⁶ ...................................................... H05K 7/12
[52] U.S. Cl. ........................... 361/754; 361/752; 361/759; 361/801; 439/160; 211/41.17
[58] Field of Search .................................. 361/726, 727, 361/740, 748, 754, 755, 759, 798, 801; 439/157, 160, 911; 211/41.17

[56] References Cited

U.S. PATENT DOCUMENTS

| 4,885,436 | 12/1989 | Pham et al. . | |
|---|---|---|---|
| 5,289,347 | 2/1994 | McCarthy et al. . | |
| 5,373,419 | 12/1994 | Wright | 361/755 |
| 5,504,656 | 4/1996 | Joist | 361/754 |
| 5,629,836 | 5/1997 | Wright | 361/755 |

FOREIGN PATENT DOCUMENTS

| 0194515 | 9/1986 | European Pat. Off. . |
|---|---|---|
| 0304772 | 3/1989 | European Pat. Off. . |
| 0313270 | 4/1989 | European Pat. Off. . |
| 0369025 | 5/1990 | European Pat. Off. . |
| 0534674 | 3/1993 | European Pat. Off. . |
| 0579859 | 1/1994 | European Pat. Off. . |
| 2746319 | 4/1978 | Germany . |
| 4105948 | 5/1992 | Germany . |
| 19507712 | 4/1996 | Germany . |
| 2298741 | 9/1996 | United Kingdom . |

OTHER PUBLICATIONS

Leiterplattenausbau ohne Systemunterbrechung mit Honeywell Schaltern und Sensoren, Honeywell Outline, *Sensorik und Automation*, vol. 9, No. 1, pgs. 10,12, Date Not Provided.

*Primary Examiner*—Leo P. Picard
*Assistant Examiner*—Jayprakash N. Gandhi
*Attorney, Agent, or Firm*—Sughrue, Mion, Zinn, Macpeak & Seas, PLLC

[57] ABSTRACT

The front system has an upper and a lower end piece (5) which are fastened to the upper and lower front corner region (3), respectively, of the printed circuit board assembly (3). An upper and/or a lower lever pull handle (19), which is fitted to the upper and/or lower end piece respectively, is used for levering the printed circuit board assembly into and out of the mounting rack. A latching mechanism (25) is provided to fix the lever pull handle in the appropriate position when the printed circuit board assembly has reached the point where it has been fully inserted into the mounting rack. A push-button element (31) is integrated in the upper and/or lower end piece. When the lever pull handle is in its fixed position, the push-button element may be depressed to thereby act upon the appropriate lever pull handle, thereby actuating an external, electrical switching element. The electrical switching element, in turn, electrically enables and disables the printed circuit board assembly. The invention has the advantage of allowing the push-button element, as a result of its integration in a lower or an upper end piece, to be brought into an exactly definable position, so that even external switching elements with different external designs may be permanently and reliably actuated via the lever pull handle.

18 Claims, 3 Drawing Sheets

FRONT SYSTEM OF A PRINTED CIRCUIT BOARD ASSEMBLY HAVING AN INTEGRATED PUSH-BUTTON ELEMENT FOR ACTIVE-PASSIVE SWITCHING

This is a Continuation of International Application PCT/DE95/01078, with an international filing date of Aug. 16, 1995, the disclosure of which is incorporated into this application by reference.

FIELD OF AND BACKGROUND OF THE INVENTION

The invention relates to new and useful improvements in a front system for mounting a printed circuit board onto a mounting rack. More particularly, the invention relates to a front system provided with a push-button element used for switching the circuit board between active and passive states.

EP 0 304 772 B1 discloses a front plug system for a flat structural component (printed circuit board) having an end contact device. In this case, a front plug connector can be plugged onto a front element which is located at the end of a printed circuit board assembly. This is carried out by means of a pivot movement, in that the front plug connector can be attached into a pivot bearing at one end of the front element. Located at the other end of the front element and front plug connector is an end contact device which does not engage until after the front plug connector is attached completely to the front element. The engagement is achieved through operation of a closure device, which is preferably provided by a screw that is likewise inserted into the other end of the front plug connector, so that the operating contacts of the end contact device do not engage until the screw has been screwed completely into an oppositely located thread in the front element, and the front element has thereby been attached completely. In this way, it is possible to ensure that the electrical signals which are passed via the front element and the front plug connector are not released until all the contacts between the front element and the front plug connector have been closed, this release of the electrical signals taking place simultaneously. Conversely, it ensures that the front plug connector is restricted before one of the contacts is interrupted when the front plug connector is pivoted away.

Printed circuit board assemblies can be levered into and out of the plug-in slot in a mounting rack by means of insertion and withdrawal aids such as those known, e.g., from EP 0 194 515 B1. However, even in the case of such printed circuit board assemblies that can be levered in and out, it is sometimes necessary to bring about organized release and/or interruption of the entire signal exchange, which proceeds via their rear plug connectors to a mounting rack motherboard and a data bus located there. Thus, e.g., at the start of levering out a printed circuit board assembly, it is desirable to bring about complete interruption of the signal exchange to and from the printed circuit board assembly without having to disconnect the contact between the plug connector and the motherboard, even though other contacts are not yet disconnected.

In order to solve this problem, the document Honeywell Outline, Sensors and Automation, Year 9, Issue 1, pages 10, 12 proposes, in the article "Leiterplatten-ausbau ohne Systemunterbrechung mit Honeywell Schaltern und Sensoren" [Printed circuit board removal without system interruption using Honeywell switches and sensors] that, for example, a switch be fitted to the edge of the printed circuit board, either on its top or bottom, and be connected to the main power supply, e.g. via appropriate conductor tracks. An interlocking mechanism, which fixes the printed circuit board in its position in the mounting rack, acts on the switch. In the interlocked state, a bolt of the interlocking mechanism rests on that edge of the printed circuit board to which the switch is fitted and causes the switch to operate, and thus causes electrical activation of the printed circuit board. If, in contrast, the bolt is pivoted away from the edge, then the switch is interrupted and the printed circuit board is switched to be electrically inactive. An infrared component can also be used instead of the switch.

OBJECTS OF THE INVENTION

A major problem with such devices is the fact that precise positioning of the switch on the edge of the printed circuit board is extraordinarily difficult. If, for example, the switch is soldered to appropriate conductor tracks on the printed circuit board surface, then, because of the soldering process, it is difficult to ensure that the switching lever, particularly in the case of a miniature switch, can be positioned sufficiently accurately that it is operated correctly when the bolt comes to rest on the edge of the printed circuit board. Another problem is that many standardized switches are difficult to incorporate into the mechanism used for inserting and withdrawing the circuit board.

One object of the invention, therefore, is providing a front system for a printed circuit board assembly equipped with electrical active-passive switching for the printed circuit board that is both precise and durable. A further object of the invention is providing a front system of elegant design that is both easy to operate and reliable. Yet another object is to provide a design that does not require the electrical switch to be incorporated into the insertion and withdrawal mechanism.

SUMMARY OF THE INVENTION

These and other objects are achieved by the teaching of the independent claims. Further advantageous embodiments of the invention are defined in the dependent claims. According to one formulation, the invention is directed to a front system for affixing a printed circuit board assembly onto a mounting rack, which system includes an end piece, a lever handle and a mechanical push-button element. The end piece is fastened to a front corner region of the printed circuit board assembly and includes a first latching element. The lever handle is pivotable between a latched position and an unlatched position for levering the printed circuit board assembly into and out of the mounting rack and includes a second latching element. The mechanical push-button element is integrated into the end piece. An electrical switching element, on the other hand, is mounted external to the end piece. The two latching elements engage one another in the latched position but fail to engage each other in the unlatched position. The mechanical push-button element is disposed between the lever handle and the electrical switching element such that it switches the electrical switching element from a first switching state (e.g. passive) to a second switching state (e.g. active) when the lever handle pivots from the unlatched position to the latched position.

BRIEF DESCRIPTION OF THE DRAWINGS

The invention, along with various advantageous refinements and associated advantages, is explained in more detail below with reference to the preferred embodiments shown in the drawing figures, in which.

DETAILED DESCRIPTION OF THE PREFERRED EMBODIMENTS

Figure 1:
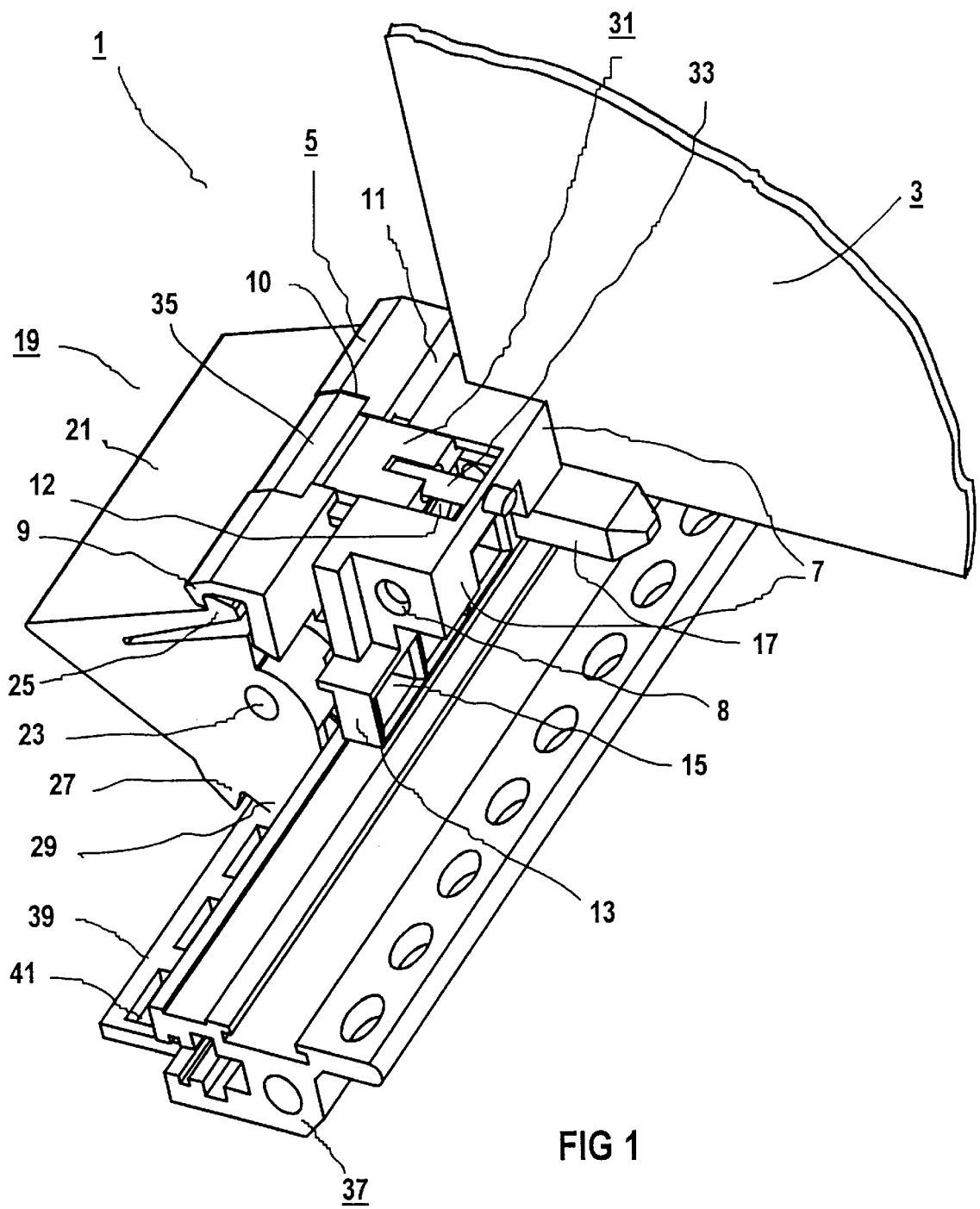
FIG. 1 shows a perspective side view of a lower transverse rail of a mounting rack and of a lower end piece, according to one preferred embodiment of the invention, for a front panel of a printed circuit board having a lever pull handle.

FIG. 1 shows a perspective side view of the lower, front end region 1 of a front system, designed according to the invention, for a printed circuit board assembly 3. The printed circuit board assembly 3 is shown in FIG. 1 in the form of a representative lower, front corner region thereof. The lower end region 1 in this case rests on the lower transverse rail 37 of a mounting rack. The main components of the lower, front end region 1 of the front system are a lower lever pull handle 19, a lower end piece 5, and a front panel, which is not shown in FIG. 1. The lower end piece 5 has a central retaining function since it is used, on the one hand, as a support for the lever pull handle 19, which is mounted, in particular, via a hole 23 and an associated pin (not shown), such that it can rotate. On the other hand, the lower end piece 5 is also used for holding the lower end of the front panel, which is advantageously pushed into a groove 11 and is held via a screw that engages with a hole 12. The connection between the lower end piece 5 and the front, lower corner of the printed circuit board assembly is preferably achieved by a retaining block 7 and by means of a screw which engages a hole 8 therein. The retaining block 7 forms part of the overall lower end piece 5.

Further components can be fitted onto the end piece 5. The end piece illustrated in FIG. 1 thus includes a coding block 13, into which coding chambers 15 are incorporated for inserting coding pins. These coding pins can contact other coding chambers, which are positioned in an opposing relationship on the lower transverse support 37 and are similarly fitted with complementary-coded coding pins. In this way, it is possible to ensure that only a specific, selected printed circuit board assembly can be positioned in a given plug-in slot in the mounting rack. Finally, there is also a guide pin 17 that is received by an opposing guide hole, thereby ensuring that the printed circuit board assembly is inserted correctly, without tilting.

A lower lever pull handle 19, which can be operated by operating the handle part 21, is used for levering the printed circuit board assembly 3 into and out of the corresponding plug-in slot. While the printed circuit board assembly 3 is being levered out, the handle must be pressed downwards so that at least one levering-out tab 27, projecting from the bottom of the handle, rests on an end edge 39 of the lower transverse rail 37. Conversely, while the printed circuit board assembly is being levered in, the handle must be pressed upwards so that at least one levering-in edge 29, which likewise projects from the underside of the handle, can be supported in the interior of at least one engagement cutout 41. As evident from FIG. 1, the engagement cutouts 41 are likewise located in the region of the end edge 39 of the lower transverse rail 37.

Normally, there is also provided some mechanism on the end piece 5 by means of which the lever pull handle 19 is fixed in the appropriate position, once the printed circuit board assembly 3 has reached the point at which it is inserted into the mounting rack completely. For this purpose, as illustrated in FIG. 1, the lever pull handle 19 advantageously has a latching tab 25 on its upper surface. This latching tab 25 is preferably mounted resiliently and is directed towards the end piece 5 such that it projects upwards and engages behind a latching edge 9 on the lower end piece 5. The latching edge 9, conversely, is directed towards the lever pull handle 19 and points downwards so that it can clasp the latching tab 25.

Although not illustrated in FIG. 1, a corresponding arrangement, composed of an upper end piece with an upper lever pull handle mounted on it, such that it can rotate, is fitted in the same manner to the front, upper corner region of the printed circuit board assembly 3. This upper lever pull handle engages in a corresponding upper transverse rail of a mounting rack for levering the front system in and out.

According to a preferred embodiment of the invention, a mechanical push-button element is integrated in the lower and/or the upper end piece. The push-button element is mounted in the end piece in such a manner that the lever pull handle corresponding to that end piece causes the push-button element to activate an external electrical switching element when the lever pull handle is in its fixed position. In this way, it is possible to electrically enable the printed circuit board assembly, for example by activating its power supply. Conversely, the printed circuit board assembly switches to be electrically passive when the lever pull handle disengages from the push-button element integrated into the end piece. More specifically, levering out the printed circuit board assembly automatically causes the lever pull handle to disengage from the push-button element, which, in turn, causes the push-button element to switch off the external electrical switching element. This release of the switching element results in the electrical power supply to the printed circuit board assembly being rendered passive.

Figure 2:
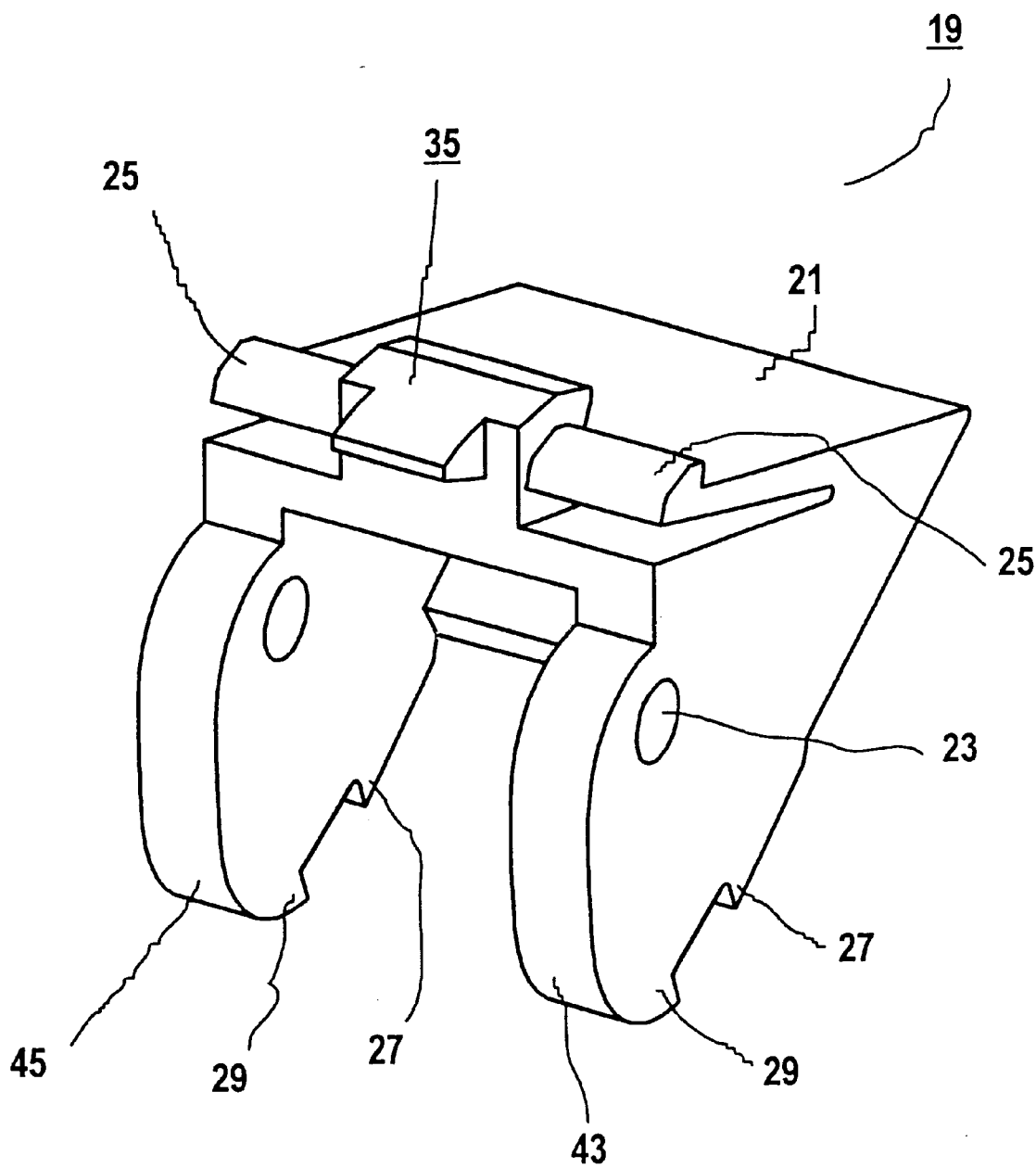
FIG. 2 shows a perspective side view of a lever pull handle for the front system of FIG. 1.

By way of example, FIG. 1 shows a mechanical push-button element 31 which is integrated into the lower corner end piece 5. This push-button element 31 is preferably mounted in a retaining slot, or cut-out opening, 10 which extends into the region of the latching edge 9 of the end piece 5. On a rear side of the end piece 5 facing the printed circuit board assembly, the push-button element projects far enough beyond the end piece that an external switching element, which is not illustrated in FIG. 1 for reasons of clarity, is thereby actuated to be rendered selectively active or passive. The mechanical push-button element 31 is operated by the impact of a rear side of the lever pull handle 19 when the lever pull handle 19 reaches its fixed, i.e. latched, position. According to one embodiment, this operation is carried out by an end surface of a latching tab 25 of the lever pull handle 19, that faces the lower end piece 5. The latching tab 25 is designed as a spring catch with a latching tab pointing generally upwards. In the case of another embodiment, as illustrated in FIGS. 1 and 2, the lever pull handle 19 is designed to have a projecting thrust member 35, preferably on a top surface thereof, which acts on the mechanical push-button element 31 when the lever pull handle 19 approaches its fixed position.

Figure 4:
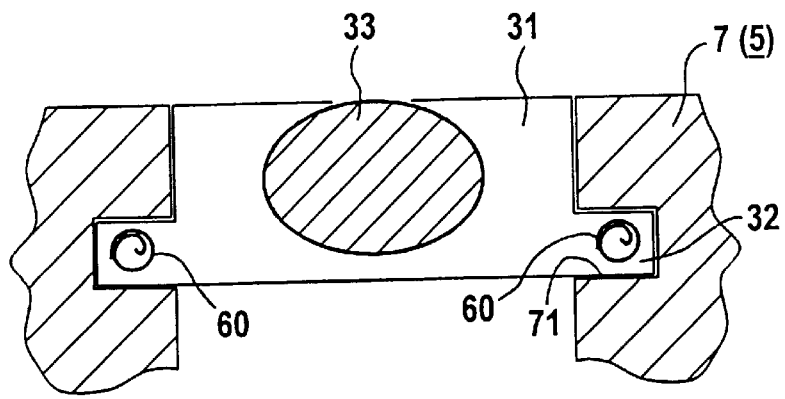
FIG. 4 shows a cross-sectional view along the line IV—IV in FIG. 3.

The push-button element 31 is advantageously designed in the form of a slide that is mounted in the end piece 5, as illustrated in FIG. 1. According to one design shown generally in FIG. 1 and more specifically in FIG. 4, the push-button element 31 is slidably mounted in tracks 71, provided in the end piece 5 and its retaining block 7, by means of tabs 32 that project laterally outward from the push button element 31. Further, the push-button element 31 is preferably designed with a contact bolt 33 fitted thereto and extending generally in the direction of the printed circuit board assembly. This contact bolt 33 makes it possible to actuate a switching element that is disposed outside the end piece 5 itself and on a side of the end piece 5 facing the circuit board assembly.

Additionally, a spring element is preferably provided for acting on a side of the push-button element 31 so as to hold the push-button element 31 in a rest position extended toward the lever pull handle 19 as long as the lever pull handle is not located in the fixed position but to give way to the pressure exerted by the lever pull handle when it is latched. In other words, when the lever pull handle 19 can still move to some extent on its rotation axis 23, as a result of the printed circuit board assembly not being completely pushed into the mounting rack, and the upwardly pointing latching tab 25 of the spring catch is not yet engaged in the downwardly directed latching edge 9 of the end piece 5, the biasing force of the spring element holds the push-button element 31 extended towards the lever pull handle 19. If, in contrast, the lever pull handle 19 is moved into the fixed position, i.e. the spring catch 25 is moved to engage the latching edge 9 and reach the position illustrated in FIG. 1, then the push-button element 31 is forced in the direction of the printed circuit board assembly. This lateral shift in the position of the push-button element 31 causes the element 31 to activate the externally mounted switching element. If, as illustrated in FIG. 1, a contact bolt 33 is provided for extending the length of the slide 31, then the spring element can be designed in the form of a spiral spring located around the contact bolt 33. In the variation illustrated in FIG. 4, spring elements 60 are arranged in the tracks 71 of the end piece 5 and press with symmetrical force against the tabs 32 of the push-button element 31. According to yet another alternative, the "resetting force" for returning the push-button element 31 to its passive rest position can be exerted instead or additionally by the external switching element itself.

Figure 3:
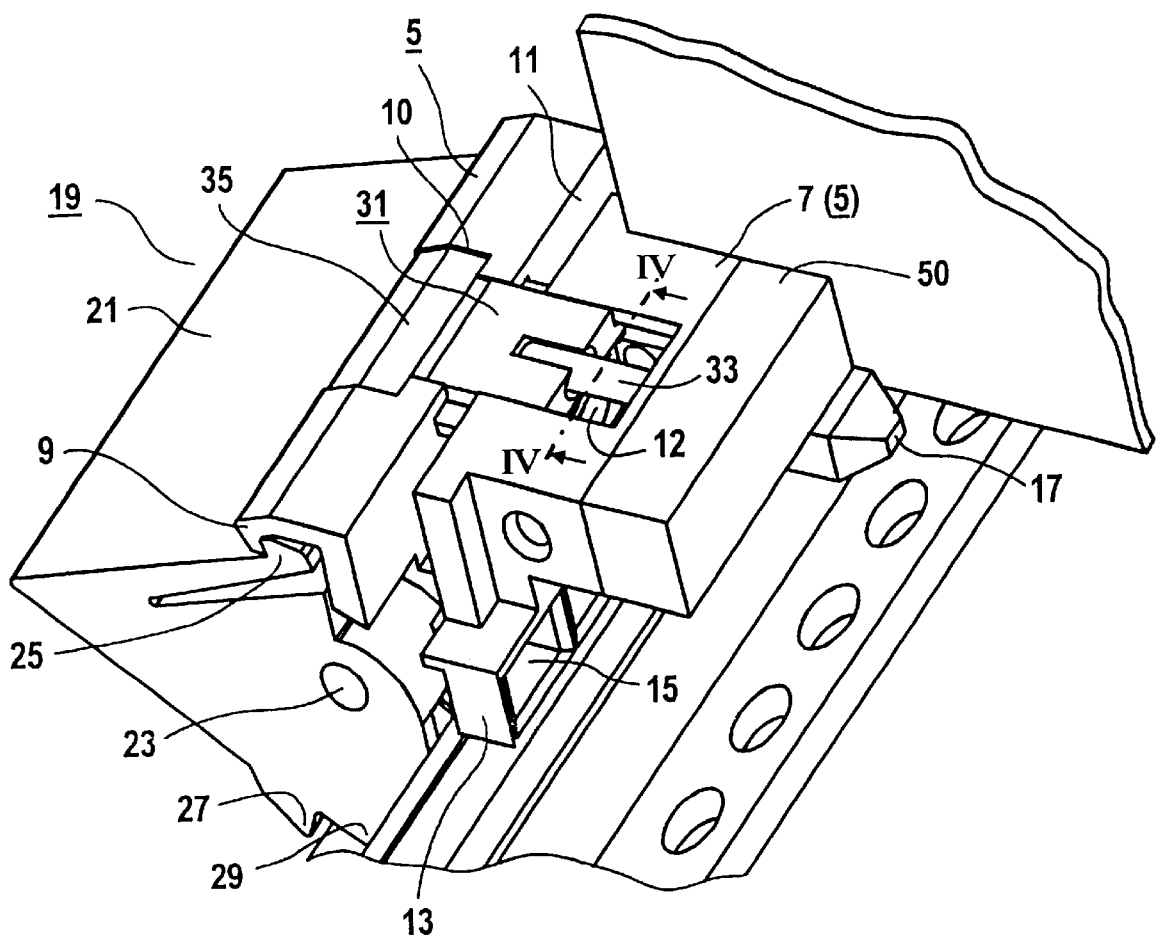
FIG. 3 shows a detail of the lower transverse rail and the lower end piece of FIG. 1, with an electrical switching element mounted to a sidewall of the end piece.

The front system according to the invention has the particular advantage that it is not necessary to place any special requirements on the design of the external switch element itself. If the switch element itself were incorporated into the corner piece, various constraints would be placed in particular on the external dimensions of the switch element. Instead, according to the invention, it is the push-button element, instead of the switch element, that is integrated into the corner piece. Switching movement is thus transmitted from the lever pull handle to the switch element via the push-button element. It thereby becomes possible to select from a wide range of switching elements and to connect them in various locations accordingly. Thus, for example, as shown in FIG. 3, the external switching element 50 activated by the mechanical push-button element 31 can be affixed on the outside of the retaining block 7 of the end piece 5, e.g. by means of bonding. In this case, it is advantageous to electrically connect the switching element 50 to the printed circuit board assembly 3 by means of a cable connection or cable plug connection provided with appropriate connecting contacts. Alternatively, the external electrical switching element 50 activated by the mechanical push-button element 31 can also be fitted directly on an upper surface of the printed circuit board assembly 3. In either arrangement, the integrated push-button element 31 performs a transmission function by imparting switching movements from the lever pull handle to the electrical switching element.

Front systems according to the invention have the advantage that the push-button element 31 can be moved very accurately into a precisely definable position as a result of its integration into the lower or upper end piece of the front system. Accordingly, the invention provides a particularly useful design for incorporating an active-passive switching functionality into front systems for printed circuit board assemblies. The invention further renders it possible to operate the electrical switching element durably, reliably and without wear via the lever pull handle even though the switching element itself is not suited to be integrated into the end piece or to be affixed in close proximity to the end piece, e.g., because the switching means of the switching element has only a very short switch actuation path, or because the switching element has an external form or internal method of operation (e.g. electrical, magnetic or optical) that renders it unsuitable.

FIG. 2 shows a perspective side view of a preferred embodiment of a lever pull handle 19 for the front system according to the invention. The handle part 21 is supported by two supporting limbs 43, 45, which are configured to be mounted on an upper or a lower end piece by virtue of rotating about respective holes in the mounting rack, for the introduction of at least one retaining pin. Each of the two supporting limbs 43, 45 has a levering-out tab 27 and a levering-in edge 29 on its underside, for levering-in and levering-out the associated printed circuit board assembly into and out of the corresponding plug-in slot in the mounting rack, as previously described. At least one spring catch 25 projects from the handle part 21 on the top of the lever pull handle in such a manner that it clamps to the latching edge 9 of the end piece 5 and thereby latches the lever pull handle. In the case of the preferred embodiment according to FIG. 2, two spring catches 25 are arranged on the outer sides of the lever pull handle and flank a thrust member 35 which is arranged centrally on the top of the handle part 21 and which projects in the direction of the end piece 5. The end of the thrust member 35 acts on the mechanical push-button element 31 when the lever pull handle 19 is approaching its fixed, latched position by pressing the extended push-button element 31 laterally into the end piece 5 in the direction of the switching element.

The embodiment of the lever pull handle 19 according to FIG. 2, in addition to its sturdy construction, exhibits a particularly favorable symmetry. As a result, the forces which are required for levering a printed circuit board assembly in and out can be transmitted from the handle part 21 into the supporting limbs 43, 45 easily and durably. In addition, the switching force for the external electrical switching element is introduced centrally and directly onto the integrated push-button element 31 by the central thrust member 35, thereby avoiding tilting transverse force components that could potentially damage the arrangement.

The above description of the preferred embodiments has been given by way of example. From the disclosure given, those skilled in the art will not only understand the present invention and its attendant advantages, but will also find apparent various changes and modifications to the structures disclosed. It is sought, therefore, to cover all such changes and modifications as fall within the spirit and scope of the invention, as defined by the appended claims, and equivalents thereof.

What is claimed is:

1. Apparatus, comprising:
   a) an end piece fastened to a front corner region of a printed circuit board assembly, said end piece comprising a first latching element;
   b) a lever handle pivotable between a latched position and an unlatched position for levering the printed circuit board assembly into and out of a mounting rack, said lever handle comprising a second latching element;
   c) a mechanical push-button element integrated into said end piece; and
   d) an electrical switching element mounted externally of said end piece; wherein:
       said first latching element engages said second latching element in the latched position;
       said first latching element fails to engage said second latching element in the unlatched position; and
       said mechanical push-button element is disposed between said lever handle and said electrical switching element for switching said electrical switching element from a first switching state to a second switching state when said lever handle pivots from the unlatched position to the latched position.

2. Apparatus according to claim 1, wherein said end piece has an orifice into which said mechanical push-button element is slidably inserted.

3. Apparatus according to claim 1, further comprising at least one spring interposed between said end piece and said push-button element for biasing said push-button element away from said electrical switching element.

4. Apparatus according to claim 1, wherein:
said electrical switching element is mounted beyond an outer sidewall of said end piece without contacting said end piece; and
said push-button element comprises a contact bolt extending through the outer sidewall of said end piece in a direction of said electrical switching element.

5. Apparatus according to claim 1, wherein:
said electrical switching element is fastened on an outer sidewall of said end piece and is electrically connected to the printed circuit board assembly.

6. Apparatus according to claim 1, wherein said lever handle comprises:
two latching tabs configured and positioned to engage said first latching element; and
a projecting thrust member positioned between said latching tabs and in opposition to said push-button element.

7. Apparatus according to claim 3, wherein:
said end piece comprises at least one guide structure for slidably supporting said push-button element; and
said lever handle comprises:
two latching tabs configured and positioned to engage said first latching element; and
a projecting thrust member positioned between said latching tabs and depressing said push-button element against said electrical switching element in opposition to the biasing force of said spring when said lever handle is in the latched position.

8. Front panel system, comprising:
a) a front element fastened to a printed circuit board assembly, said front element comprising a first latching element;
b) a lever handle pivotable between a latched position and an unlatched position for levering the printed circuit board assembly into and out of a mounting rack, said lever handle comprising a second latching element; and
c) a mechanical push-button element integrated into said front element and arranged to activate the printed circuit board assembly in a first push-button position and to deactivate the printed circuit board assembly in a second push button position;
wherein:
said first latching element engages said second latching element in the latched position;
said first latching element fails to engage said second latching element in the unlatched position; and
said lever handle is disposed in a position for moving said push-button element from the second push-button position to the first push-button position when said lever handle pivots from the unlatched position to the latched position.

9. Front panel system according to claim 8, wherein said front element has an orifice into which said push-button element is slidably inserted.

10. Front panel system according to claim 8, wherein:
said front element comprises at least one track and said push-button element comprises at least one slide; and
said slide is slidably engaged with said track to move between the first and second push-button positions.

11. Front system, comprising:
a) an upper and a lower end piece which are fitted to an upper and a lower front corner region, respectively, of a printed circuit board assembly;
b) a lever pull handle, which is fitted to one of said upper and said lower end piece, for levering the printed circuit board assembly into and out of a mounting rack, said lever pull handle having means by which said lever pull handle is fixed in a latched position when the printed circuit board assembly is in a fully inserted position in the mounting rack; and
c) a mechanical push-button element integrated in said one end piece such that said push-button element is actuated by said lever pull handle to activate an electrical switching element external to said one end piece when said lever pull handle is in the latched position.

12. Front system according to claim 11, further comprising spring means acting on said push-button element in such a manner that said push-button element is held in a rest position, facing said lever pull handle, as long as said lever pull handle is not in the latched position.

13. Front system according to claim 11, wherein said push-button element comprises a slide which is guided in said one end piece.

14. Front system according to claim 11, wherein:
the electrical switching element is remotely arranged beyond an outer sidewall of said one end piece; and
a contact bolt is fitted to said push-button element and extends through the outer sidewall of said one end piece in a direction of the electrical switching element for activating the electrical switching element.

15. Front system according to claim 11, wherein:
the electrical switching element is fastened onto an outer sidewall of said end piece and is electrically connected to the printed circuit board assembly.

16. Front system according to claim 11, wherein the electrical switching element is fastened onto a surface of the printed circuit board assembly.

17. Front system according to claim 11, wherein said lever pull handle comprises a projecting thrust member configured and positioned to engage said push-button element when said lever pull handle approaches the latched position.

18. Front system according to claim 17, wherein:
said means for fixing said lever pull handle in the latched position comprise two spring catches having latching tabs on a surface of said lever pull handle facing said one end piece; and
said thrust member is positioned centrally on the facing surface and between said two spring catches.

* * * * *